United States Patent
Maier et al.

(10) Patent No.: US 6,366,436 B1
(45) Date of Patent: Apr. 2, 2002

(54) ELECTRONIC DEVICE FOR USE IN REGIONS SUBJECT TO EXPLOSION HAZARDS

(75) Inventors: Winfried Maier, Maulburg; Hartmut Güthner, Weil am Rhein, both of (DE); Roberto Cudini, Basel (CH)

(73) Assignee: Endress + Hauser GmbH + Co., Maulberg (DE)

( * ) Notice: Subject to any disclaimer, the term of this patent is extended or adjusted under 35 U.S.C. 154(b) by 0 days.

(21) Appl. No.: 09/268,343

(22) Filed: Mar. 16, 1999

(30) Foreign Application Priority Data

Mar. 17, 1998 (EP) .............................. 98104762

(51) Int. Cl.[7] ...................... G01F 23/284; G01L 19/14
(52) U.S. Cl. ................ 361/93.9; 439/709; 73/35.17; 73/35.14
(58) Field of Search ........................... 361/1, 2, 7, 115, 361/284, 600, 93.9, 679, 18, 728–730, 724; 73/35.14, 35.17, 12.01, 1.82, 1.85; 439/136, 709

(56) References Cited

U.S. PATENT DOCUMENTS

| | | | |
|---|---|---|---|
| 4,412,265 A | 10/1983 | Buuck |
| 4,831,484 A | 5/1989 | Bruch |
| 4,850,213 A | 7/1989 | Steinebrunner et al. |
| 5,363,341 A | 11/1994 | Schwald et al. |
| 5,954,526 A | 9/1999 | Smith |

FOREIGN PATENT DOCUMENTS

| | | |
|---|---|---|
| DE | 1 089 443 | 5/1957 |
| DE | 1 886 574 | 10/1965 |
| DE | 29 46 281 | 12/1980 |
| DE | 3622268 | 2/1988 |
| DE | 86 25 990 | 10/1989 |
| DE | 195 32 646 | 3/1997 |
| JP | 09159491 | 6/1997 |
| WO | WO 91/05226 | 4/1991 |
| WO | WO 97/12206 | 4/1997 |
| WO | WO 98/14763 | 4/1998 |

OTHER PUBLICATIONS

"Electrical apparatus for potentially explosive atmospheres Increased safety e", Mar., 1994, European Standard, EN 50019, pp. 1–46.

"Electrical apparatus for potentially explosive atmospheres Flameproof enclosures d", Aug., 1994, European Standard, EN 50018, pp. 1–53.

"Electrical apparatus for potentially explosive atmospheres—Intrinsic safety i", Aug., 1994, European Standard, EN 50020, pp. 1–103.

*Primary Examiner*—Kim Huynh
(74) *Attorney, Agent, or Firm*—Bose McKinney & Evans LLP

(57) ABSTRACT

A description is given of an electronic device for use in regions subject to explosion hazards, which is small and light, can be produced cost-effectively and offers a high degree of flexibility, having a housing (1) with a connecting chamber (3), which is designed in accordance with the safety class Ex-d or Ex-e, in which there is arranged a connecting element (6) to which electric lines can be connected, and in which there is arranged a circuit (9) for limiting a current, a voltage and a power which are fed to the device via the lines during operation, the limitation being performed in accordance with the requirements of safety class Ex-i, and having an electronics chamber (4), in which there is arranged an electronic system (11) designed in accordance with the safety class Ex-i, and which can be opened, in which housing (1) the connecting chamber (3) and the electronics chamber (4) are mutually separated, and a pressure-proof electric bushing (10) is provided through which at least one output line of the circuit (9) is led from the connecting chamber (3) into the electronics chamber (4), where it is connected to the electronic system (11) during operation.

20 Claims, 2 Drawing Sheets

ELECTRONIC DEVICE FOR USE IN REGIONS SUBJECT TO EXPLOSION HAZARDS

FIELD OF THE INVENTION

The invention relates to an electronic device for use in regions subject to explosion hazards.

BACKGROUND AND SUMMARY OF THE INVENTION

Electronic devices, in particular measuring instruments, are used regularly in industrial measuring techniques at places where there is a risk of an explosion. Flour silos, filling stations and chemical plants at which explosive gases can occur may be named here as examples.

Special safety requirements are placed on devices which can be used in regions subject to explosion hazards. These have the aim of avoiding sparking which could, possibly, trigger an explosion, or of preventing a spark produced in the interior of a closed space from affecting the surroundings. This aim can be achieved in various ways, which are laid down in appropriate European standards as types of protection.

Thus, for example, in accordance with European standard EN 50 020 of 1994, there is explosion protection when devices are designed in accordance with the defined safety class therein, bearing the name of "intrinsic safety" (Ex-i). In accordance with this safety class, the values for the electric labels of current, voltage and power each have to be below a prescribed limiting value at any time in a device. The three limiting values are selected such that in the event of a fault, for example owing to a short circuit, the maximum heat produced is insufficient to generate an igniting spark. The current is held, for example, by resistors, the voltage by, for example, zener diodes, and the power by an appropriate combination of current- and voltage-limiting components below the prescribed limiting values.

A further safety class, bearing the name of "Increased safety" (Ex-e) is specified in European standard EN 50 019 of 1994. In the case of devices which are designed in accordance with said safety class, the explosion protection is achieved by virtue of the fact that the spatial distances between two different electric potentials are so large that because of the distance sparking cannot occur even in the event of a fault. However, in some circumstances this can lead to the need for circuit arrangements to have very large dimensions in order to satisfy these requirements.

A further safety class conducted under the designation of "Explosion-proof enclosure" (Ex-d) is described in European standard EN 50 018 of 1994. Devices which are designed in accordance with said safety class have a pressure-proof housing which ensures that an explosion occurring in the interior of the housing cannot be transferred to the outside. In order for them to have adequate mechanical strength, pressure-proof housings are thick-walled and thus heavy and expensive.

The USA, Canada, Japan and other countries have standards comparable to said European standards. A device is to be connected as a rule to an electric power supply, and/or means are to be provided for transmitting signals. Provided in many cases for this purpose are standardized lines which are laid up to the measurement instrument in accordance with the safety class Ex-d or Ex-e. For example, when there is an explosion hazard on site and it is necessary to provide various measuring instruments of which individual ones require so much power that they cannot be fed by an intrinsically safe supply, it is frequent to provide lines in accordance with the safety class Ex-d or Ex-e for all devices. There are also locations at which intrinsically safe supply is not available for other reasons.

Designing a measuring instrument in accordance with safety class Ex-d requires a closed pressure-proof, and thus heavy and expensive housing. Designing a measuring instrument in accordance with safety class Ex-e requires observance of the minimum spacings described above, and this can lead to large dimensions of the individual components.

It is an object of the invention to specify a device for use in regions subject to explosion hazards which does not have these disadvantages, can be produced cost-effectively and, in addition, offers a high degree of flexibility.

Pursuant to an embodiment of the present invention, there is provided an electronic device for use in regions subject to explosion hazards. The electronic device includes a measurement instrument, a connecting chamber, a connecting element, a limiting circuit, an electronics chamber, and an electronic system. The measurement instrument of the electronic device is operable to generate measurement signals, and the connecting chamber of the electronic device includes walls designed to contain an explosion within the connecting chamber. The connecting element of the electronic device is arranged in the connecting chamber of the electronic device and is operable to receive electric lines supplying a current, a voltage, and a power. The limiting circuit of the electronic device is arranged in the connecting chamber and is operable to receive the current, the voltage and the power from the connecting element. The limiting circuit is further operable to provide a limited current, a limited voltage and a limited power that are below prescribed limiting values selected to ensure that if a fault occurs insufficient heat is produced to generate an igniting spark. The electronics chamber is separate from the connecting chamber and includes an opening and a cover that is operable to close the opening. The electronic system is arranged in the electronics chamber and is powered by the limited current, the limited voltage and the limited power of the limiting circuit. The electronic system is operably coupled to the measurement instrument to receive measurement signals and is designed to ensure if a fault occurs insufficient heat is produced to generate an igniting spark.

In accordance with a further development of the invention, space is provided in the electronics chamber for accommodating a display and/or operating element.

In accordance with a preferred embodiment, the display and/or operating element can be removed with the electronics chamber open.

In accordance with a preferred embodiment, the electronic system is designed as a replaceable plug-in module.

In accordance with a further preferred embodiment, the display and/or operating element can be mounted on the plug-in module by means of a detachable mechanical plug-in connection.

In accordance with a preferred embodiment, the display and/or operating element is connected via a line to the electronic system, and a device for holding the line is provided in the electronics chamber.

In accordance with a further preferred embodiment, the electronics chamber can be closed by a cover having a window, and the display and/or operating element is visible from outside through the window with the cover closed.

An advantage of the invention consists in that the housing in the region of the electronics chamber can have very thin walls by comparison with a chamber designed in accordance with safety class Ex-d. It is therefore lighter and more cost-effective.

Because of the intrinsically safe design of the electronic system, the latter has smaller dimensions than a corresponding electronic system designed in accordance with safety class Ex-e.

The increased space requirement caused by safety class Ex-e, or the requisite pressure resistance stipulated by safety class Ex-d is limited exclusively to the connecting chamber. All succeeding constituents have lesser dimensions, and the associated housing sections have thinner walls and are thus lighter and more cost-effective.

A further advantage consists in that the electronics chamber can be opened during operation without needing to fear an explosion. There is consequently a substantial increase in flexibility with reference to the possibilities of using the device, and to its operability. Here, flexibility is understood, for example as the possibility of accessing the electronic system on site without the need for special precautions, for example switching off a system and/or parts thereof. A defective electronic system can be replaced, and it is possible to realize operation in situ in a simple way, for example by means of buttons.

BRIEF DESCRIPTION OF THE DRAWINGS

The invention and further advantages will now be explained in more detail with the aid of the figures in the drawing, in which an exemplary embodiment of a device for use in regions subject to explosion hazards is represented; identical parts are provided in the figures with identical reference numerals.

In the drawing.

DETAILED DESCRIPTION OF EXEMPLARY EMBODIMENT OF THE INVENTION

Figure 1:
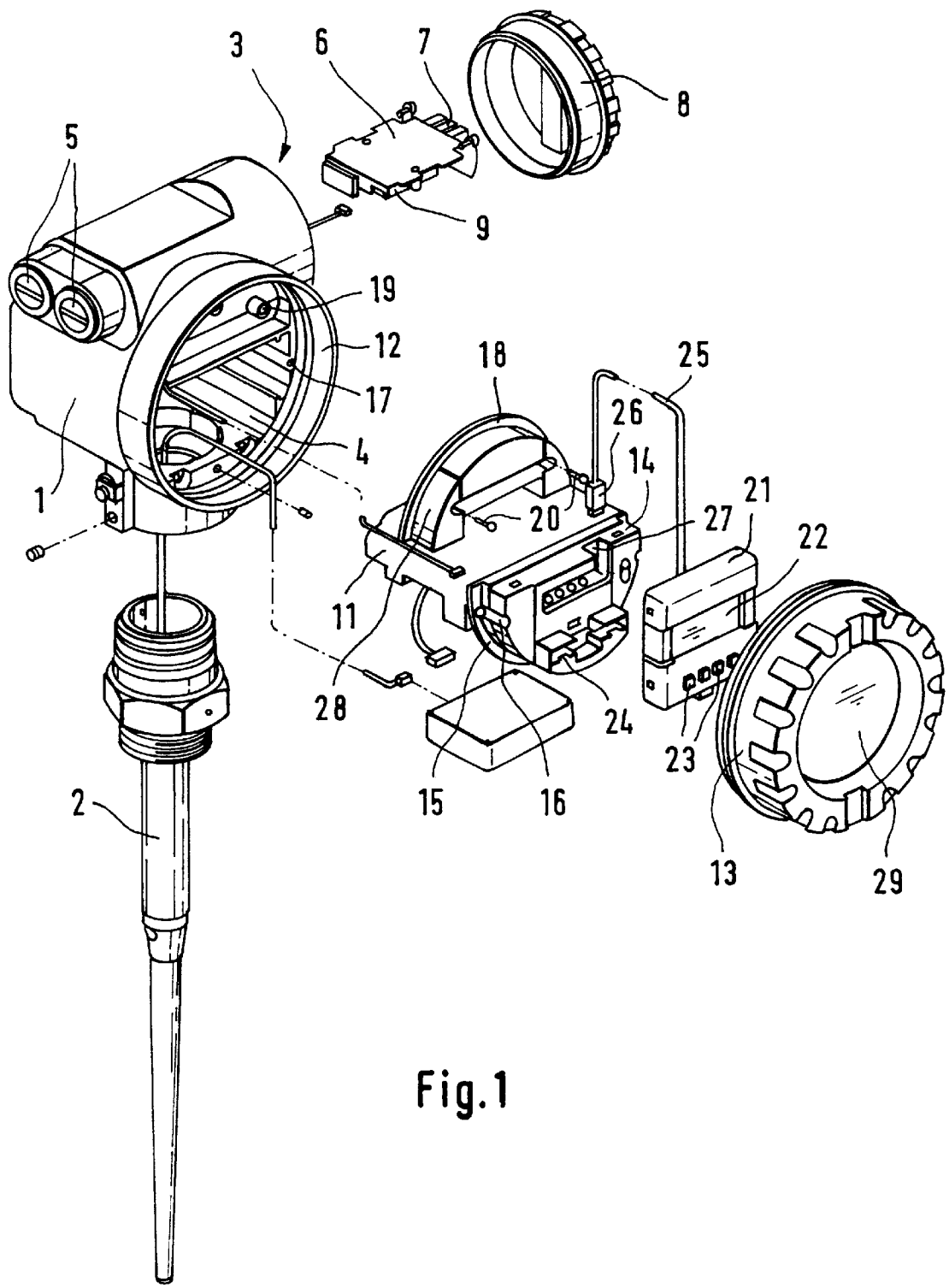
FIG. 1 shows an exploded representation of a measuring instrument.

FIG. 1 shows an exploded representation of a device for use in regions exposed to explosion hazards. In the exemplary embodiment, the device is a measuring instrument having a housing 1 and a measuring unit 2. Here, the measuring unit 2 is an antenna by means of which microwaves are transmitted and/or received. Microwaves are used, for example, for level measurement. In this case, the device is arranged above the level to be measured, the time of flight of the microwaves from the antenna to the surface of the filled material and back is ascertained, and the level is determined therefrom. The invention equally also relates to other devices, in particular to other measuring instruments such as, for example, level measuring instruments based on other measuring principles, pressure gauges, differential pressure gauges or flow-rate meters, in particular vortex velocity flowmeters.

Figure 2:
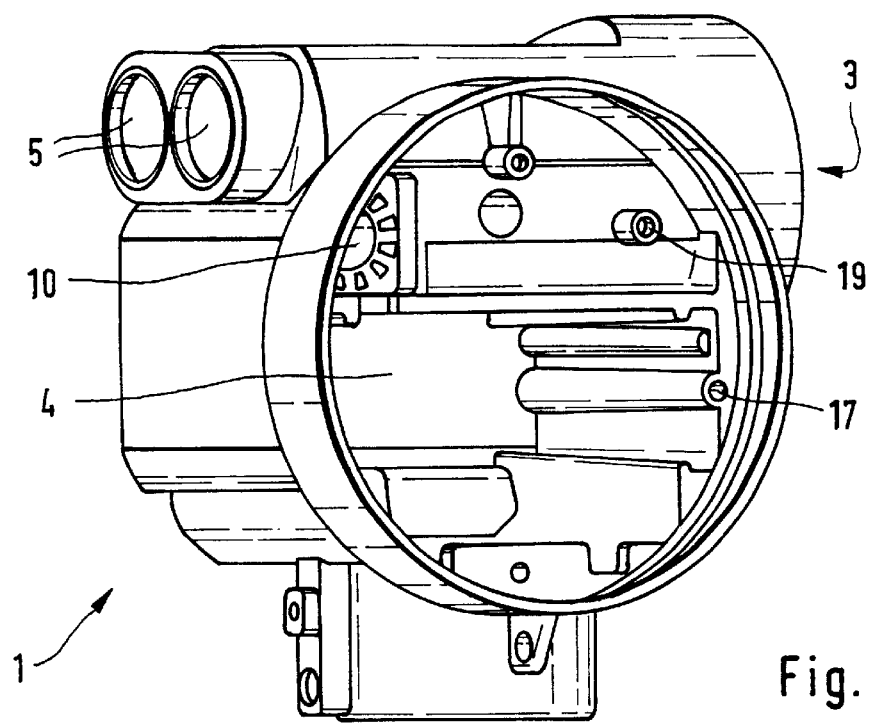
FIG. 2 shows a view of the housing of FIG. 1.
Figure 3:
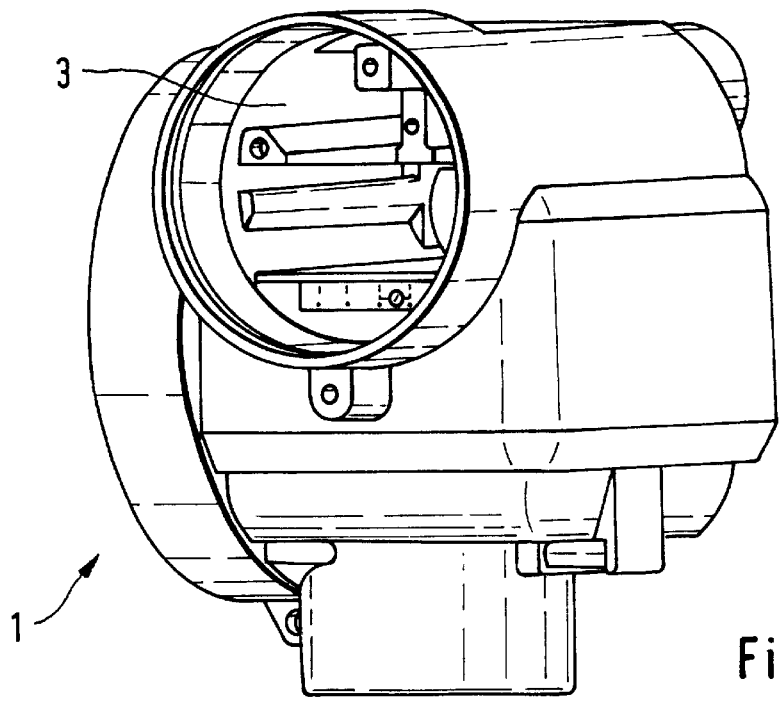
FIG. 3 shows a further view of the housing of FIG. 1.

The housing 1 has two regions which are completely separate from one another, a connecting chamber 3 and an electronics chamber 4. FIG. 2 shows a view of the housing 1 in which the electronics chamber 4 is open to examination, and FIG. 3 shows a further view of the same, in which the connecting chamber 3 is open to examination.

The connecting chamber 3 is designed in accordance with the requirements of safety class Ex-d or Ex-e. The electric connection of the device is performed in the connecting chamber 3. Provided for this purpose are two entry fittings 5 through which lines laid up to the device in accordance with safety class Ex-e or Ex-d are to be inserted into the device. With a measuring instrument, it is usually necessary to provide either two supply lines and two signal lines, or else two lines which perform both the supply of the device and signal transmission. Arranged in the connecting chamber 3 is a connecting element 6 to which the lines can be connected electrically. As represented diagrammatically in FIG. 1, for example, this is a terminal block 7. In the case of a connecting chamber 3 designed in accordance with safety class Ex-e, the terminal block 7 is to be designed in accordance with the regulations for increased safety Ex-e, that is to say, in particular, adequately large spacings are to be provided between the individual terminals. On a side opposite the entry fittings, the connecting chamber 3 has an opening which can be sealed by a cover 8. The connecting element 6 is designed as a withdrawable element which can be removed from the connecting chamber 3. During mounting, the first step is for the lines to be led through the entry fittings 5 and the connecting chamber 3 and connected to the terminal block 7. Subsequently, the connecting chamber 3 is to be sealed with the cover 8. If the connecting chamber 3 is designed in accordance with safety class Ex-d, the cover 7 preferably has a thread which ensures both pressure-proofness and flame-proofness in accordance with safety class Ex-d.

Since the connecting chamber 3 is designed in accordance with safety class Ex-d or Ex-e, the connecting chamber 3 may only be opened when the lines have been de-energized. The connecting chamber 3 is always sealed during operation.

A circuit 9 for limiting current, voltage and power fed from the device via the lines in accordance with safety class Ex-i is arranged on the connecting element 6. Such circuits are described for example in the older European patent application of file reference 97 81 349.7 dated Jun. 4, 1997. Further circuits of this type are, for example, described in DE-C 36 22 268 and in U.S. Pat. No. 4,412,265.

As already described, the connecting chamber 3 and the electronics chamber 4 are completely separate from one another. A pressure-proof electric bushing 10 is provided between the two chambers. The bushing 10 is illustrated diagrammatically in FIG. 2. Pressure-proof bushings satisfying the requirements of safety class Ex-d are commercially available.

An electronic system 11 designed in accordance with safety class Ex-i is arranged in the electronics chamber 4. Output lines of the circuit 9 are led through the bushing 10 from the connecting chamber 3 into the electronics chamber 4, where they are connected to the electronic system 11 during operation.

The electronic system 11 is, for example, an electronic measuring instrument. In the exemplary embodiment shown, it comprises, for example, a microwave module for transmitting and/or receiving microwaves, which is connected to the antenna, and an evaluation unit which ascertains a level from the received signals and makes available an output signal which corresponds to the level.

The electric connections between the circuit 9 and the bushing 10, and between the bushing 10 and the electronic system 11 are preferably detachable plug-in connections.

Since the electronic system is designed in accordance with safety class Ex-i, and the electronics chamber 4 and the connecting chamber 3 are mutually separated spaces, during operation the electronics chamber 4 can be opened in a region subject to explosion hazards without it being possible thereby to trigger an explosion. The electronics chamber 4 has a circular opening 12 which can be closed by a cover 13 which can be screwed into the opening 12.

The electronic system 11 is preferably designed as a replaceable plug-in module. As is to be seen from FIG. 1, the electronic system 11 is provided for this purpose with a module housing whose external geometry largely corresponds to the internal geometry of the electronics compartment 4. The module housing is provided with a front element 14 which is arranged facing the cover 13. A circumferential shoulder 15 with holes for screws 16 is provided on the front element 14. For the purpose of further fastening the module housing in the electronics chamber 4, the screws 16 are to be screwed through the holes in threaded bores 17 arranged in the electronics chamber 4, which is located opposite.

A cover 18 is additionally provided in the electronics chamber 4. The cover 18 is essentially semicircular and in the mounted state covers a wall region of the electronics chamber 4 behind which the connecting chamber 3 is located. Threaded bores 19 are provided in the wall region, and the cover 18 is fastened to the wall region by screws 20 screwed in to the threaded bores 19.

Space is provided in the electronics chamber 4 to accommodate a display and/or operating element 21. A display element serves a purpose, for example, of displaying measured values in situ. Using an operating element, a device can be set in situ in accordance with the function thereof. The element represented has both a display 22 and buttons 23 for operating the device.

The display and/or operating element 21 can be mounted on the plug-in module by means of a detachable mechanical plug-in connection. For this purpose, the front element 14 has a latching device 24 on its side facing the cover, and, on the rear side of the display and/or operating element 21, a corresponding mating component is provided, which is not represented in FIG. 1 and engages in the latching device 24 during mounting.

The display and/or operating element 21 is connected to the electronic system 11 either via a wireless connection, for example via an infrared transmitter and infrared receiver, or, as represented in FIG. 1, via a line 25. Said line 25 has at its end a plug 26 which can be plugged into a corresponding connection 27 arranged on the front element 14.

A device is provided in the electronics chamber 4 for the purpose of holding the line 25. Said device comprises a covering 28 arranged on the cover 18. The covering 28 has a slot through which the line 25 can be introduced into a cavity bounded by the covering 28 and the cover 18.

The display and/or operating element 21 can be removed with the electronics chamber 4 open. This offers the advantage that the display and/or operation can take place at a site remote from the electronics chamber 4. This is advantageous, in particular, when the device is arranged at a site difficult to access, or room is very limited in the immediate vicinity of the device.

The cover 13 with which the electronics chamber 4 can be closed preferably has a window 29. With the cover 13 closed, the display and/or operating element 21 is visible from outside through the window 29.

What is claimed is:

1. An electronic device for use in regions subject to explosion hazards, comprising:
   a housing having a connecting chamber and an electronics chamber;
   a measurement instrument operable to generate measurement signals;
   the connecting chamber comprising walls designed to contain an explosion within the connecting chamber;
   a connecting element arranged in the connecting chamber and operable to receive electric lines supplying a current, a voltage, and a power;
   a limiting circuit arranged in the connecting chamber, the limiting circuit operable to receive the current, the voltage and the power from the connecting element and provide a limited operating current, a limited operating voltage and a limited operating power that are below prescribed limiting values selected to ensure that if a fault occurs insufficient heat is produced to generate an igniting spark;
   the electronics chamber is separate from the connecting chamber, the electronics chamber comprising an opening and a cover that is operable to close the opening;
   an electronic system arranged in the electronics chamber and powered by the limited operating current, the limited operating voltage and the limited operating power from the limiting circuit, the electronic system operably coupled to the measurement instrument to receive measurement signals and designed to ensure if a fault occurs insufficient heat is produced to generate an igniting spark; and
   a bushing between the connecting chamber and the electronics chamber;
   wherein the connecting chamber and the electronics chamber are separated within the housing, and the limiting circuit is operable to provide the limited operating current, the limited operating voltage and the limited operating power to the electronic system via at least one output line that is fed through the bushing and coupled to the electronic system.

2. The device as claimed in claim 1, further comprising in which space is provided in the electronics chamber (4) for accommodating a display and/or operating element arranged in the electronics chamber.

3. The device as claimed in claim 2, in which the display and/or operating element can be removed through the opening of the electronics chamber.

4. The device as claimed in claim 3, wherein the electronic system comprises a mechanical plug-in connection to which the display and/or operating element can be mounted.

5. The device as claimed in claim 2, in which the display and/or operating element is connected via a line to the electronic system, and the electronics chamber further comprises a device for holding the line.

6. The device as claimed in claim 2, in which the cover comprises a window through which the display and/or operating element is visible when the cover closes the opening of the electronics chamber.

7. The device as claimed in claim 2, wherein the electronic system comprises a mechanical plug-in connection to which the display and/or operating element can be mounted.

8. The device as claimed in claim 1, in which the electronic system (11) is designed as a replaceable plug-in module.

9. The device as claimed in claim 8, further comprising a display and/or operating element arranged in said electronics chamber that can be removed through the opening of the electronics chamber,
   wherein said electronic system comprises a mechanical plug-in connection to which the display and/or operating element can be mounted.

10. The device as claimed in claim 1 arranged above a surface of a filled material in a container, wherein the measurement instrument comprises an antenna, the measurement instrument adapted to transmit microwaves toward the surface of the filled material via the antenna, to receive the microwaves reflected from the surface of the filled material via the antenna, and to generate the measurement signal such that the measurement signal is representative of a time for the microwaves to travel between the antenna and the surface of the filled material, and the electronic system is adapted to generate an output signal, based upon the measurement signal, that corresponds to a level of the filled material in the container.

11. An electronic device for use in regions subject to explosion hazards, comprising:

a housing having a connecting chamber and an electronics chamber;

a measurement instrument operable to generate measurement signals;

the connecting chamber having walls designed to contain an explosion within the connecting chamber;

a connecting element arranged in the connecting chamber and operable to receive electric lines supplying a current, a voltage, and a power;

a limiting circuit arranged in the connecting chamber, the limiting circuit operable to receive the current, the voltage and the power from the connecting element and provide a limited operating current, a limited operating voltage and a limited operating power that are below prescribed limiting values selected to ensure that if a fault occurs insufficient heat is produced to generate an igniting spark, the limiting circuit further designed such that spatial distances, between any two different electric potentials of the limiting circuit, prevent sparking from occurring;

the electronics chamber is separate from the connecting chamber, the electronics chamber comprising an opening and a cover that is operable to close the opening;

an electronic system arranged in the electronics chamber and powered by the limited operating current, the limited operating voltage and the limited operating power from the limiting circuit, the electronic system operably coupled to the measurement instrument to receive measurement signals and designed to ensure if a fault occurs insufficient heat is produced to generate an igniting spark; and a bushing between the connecting chamber and the electronics chamber;

wherein the connecting chamber and the electronics chamber are separated within the housing, and the limiting circuit is operable to provide the limited operating current, the limited operating voltage and the limited operating power to the electronic system via at least one output line that is fed through the bushing and coupled to the electronic system.

12. The device as claimed in claim 11, further comprising a display and/or operating element arranged in the electronics chamber.

13. The device as claimed in claim 12, in which the display and/or operating element can be removed through the opening of the electronics chamber.

14. The device as claimed in claim 13, wherein the electronic system comprises a mechanical plug-in connection to which the display and/or operating element can be mounted.

15. The device as claimed in claim 12, in which the display and/or operating element is connected via a line to the electronic system, and the electronics chamber further comprises a device for holding the line.

16. The device as claimed in claim 12, in which the cover comprises a window through which the display and/or operating element is visible when the cover closes the opening of the electronics chamber.

17. The device as claimed in claim 12, wherein the electronic system comprises a mechanical plug-in connection to which the display and/or operating element can be mounted.

18. The device as claimed in claim 11, in which the electronic system is designed as a replaceable plug-in module.

19. The device as claimed in claim 18, further comprising a display and/or operating element arranged in said electronics chamber that can be removed through the opening of the electronics chamber, wherein said electronic system comprises a mechanical plug-in connection to which the display and/or operating element can be mounted.

20. The device as claimed in claim 11 arranged above a surface of a filled material in a container, wherein the measurement instrument comprises an antenna, the measurement instrument adapted to transmit microwaves toward the surface of the filled material via the antenna, to receive the microwaves reflected from the surface of the filled material via the antenna, and to generate the measurement signal such that the measurement signal is representative of a time for the microwaves to travel between the antenna and the surface of the filled material, and the electronic system is adapted to generate an output signal, based upon the measurement signal, that corresponds to a level of the filled material in the container, and receives microwaves.

* * * * *